(12) United States Patent
Shen et al.

(10) Patent No.: US 11,248,758 B2
(45) Date of Patent: Feb. 15, 2022

(54) SURFACE LIGHT SOURCE LED DEVICE

(71) Applicant: EXCELLENCE OPTOELECTRONICS INC., Miaoli County (TW)

(72) Inventors: Wei-Po Shen, Miaoli County (TW); Chun-Ming Lai, Miaoli County (TW); Chih-Chiang Chang, Miaoli County (TW); Wen-Hsing Huang, Miaoli County (TW); Tzeng-Guang Tsai, Miaoli County (TW); Kuo-Hsin Huang, Miaoli County (TW)

(73) Assignee: EXCELLENCE OPTOELECTRONICS INC., Miaoli County (TW)

( * ) Notice: Subject to any disclaimer, the term of this patent is extended or adjusted under 35 U.S.C. 154(b) by 0 days.

(21) Appl. No.: 17/026,440

(22) Filed: Sep. 21, 2020

(65) Prior Publication Data
US 2022/0018503 A1  Jan. 20, 2022

(30) Foreign Application Priority Data

Jul. 17, 2020  (TW) .................................. 109124264

(51) Int. Cl.
| | |
|---|---|
| *F21S 4/22* | (2016.01) |
| *F21S 41/143* | (2018.01) |
| *F21S 41/176* | (2018.01) |
| *F21S 43/14* | (2018.01) |
| *F21S 43/16* | (2018.01) |

(Continued)

(52) U.S. Cl.
CPC ............... *F21S 4/22* (2016.01); *F21S 41/143* (2018.01); *F21S 41/176* (2018.01); *F21S 41/26* (2018.01); *F21S 43/14* (2018.01); *F21S 43/16* (2018.01); *F21Y 2113/10* (2016.08); *F21Y 2115/10* (2016.08)

(58) Field of Classification Search
CPC .. F21S 4/22; F21S 41/26; F21S 41/176; F21S 41/143; F21V 5/007
See application file for complete search history.

(56) References Cited

U.S. PATENT DOCUMENTS

| | | | |
|---|---|---|---|
| 8,783,899 B2* | 7/2014 | Tsai ........................ | H05K 1/142 362/225 |
| 2004/0070989 A1* | 4/2004 | Amano ................. | F21S 43/245 362/520 |

(Continued)

FOREIGN PATENT DOCUMENTS

TW            200951366 A        12/2009

OTHER PUBLICATIONS

Taiwan Patent Office, Office action dated Oct. 29, 2020.

*Primary Examiner* — Bryon T Gyllstrom
*Assistant Examiner* — Christopher E Dunay
(74) *Attorney, Agent, or Firm* — Li & Cai Intellectual Property (USA) Office

(57) ABSTRACT

A surface light source LED device includes a circuit board, at least one power input and at least two LED bar elements, the at least two LED bar elements are arranged in a staggered manner, and each of the LED bar elements includes a plurality of LED bars arranged linearly on the circuit board. Each of the LED bars has a straight strip structure and has a plurality of LED dies of the same type provided inside. The plurality of LED dies is arranged linearly at equal intervals.

12 Claims, 16 Drawing Sheets

(51) Int. Cl.
  *F21S 41/26*  (2018.01)
  *F21Y 113/10* (2016.01)
  *F21Y 115/10* (2016.01)

(56) References Cited

U.S. PATENT DOCUMENTS

| | | | | |
|---|---|---|---|---|
| 2004/0223327 | A1* | 11/2004 | Kuan | F21V 29/74 |
| | | | | 362/249.01 |
| 2012/0250309 | A1* | 10/2012 | Handsaker | F21V 5/007 |
| | | | | 362/235 |
| 2012/0275150 | A1* | 11/2012 | Yokotani | F21V 3/0625 |
| | | | | 362/235 |
| 2014/0265809 | A1* | 9/2014 | Hussell | F21V 23/06 |
| | | | | 313/3 |
| 2014/0313722 | A1* | 10/2014 | Eloff | A47B 95/043 |
| | | | | 362/249.04 |
| 2015/0285459 | A1* | 10/2015 | Kang | F21V 5/04 |
| | | | | 362/516 |
| 2018/0345846 | A1* | 12/2018 | Alisafaee | F21S 43/249 |

* cited by examiner

SURFACE LIGHT SOURCE LED DEVICE

FIELD OF THE DISCLOSURE

The present disclosure relates to a surface light source LED device, and more particularly to a LED device that can be used as wide-angle surface light sources of various structures for a vehicle lamp.

BACKGROUND OF THE DISCLOSURE

In existing technologies, with features such as high-luminance, energy-saving, multi-color, and fast-changing, LED has been widely applied in technical fields of lighting that require light sources. In the field of vehicle lamp, LED has become the most prominent light source. It is widely known that during a process of driving a vehicle, besides providing necessary road lighting, another important function of a vehicle lamp is to emit signals (signs) or warnings to other vehicles or pedestrians for raising awareness of safety. In a functional perspective, vehicle signal lamps mainly include position lights, turn signal light, and brake lights.

As the brand recognition has become more sought after, signal lights of the vehicle lamp are also not limited to providing signal, but have become an important medium to emphasize style features of a brand. As conventional lighting technologies have been lacking the capability of the realization of fashionable and creative light designs, newer technologies and materials are increasingly applied to the vehicle signal lamps. Specifically, a uniform surface light source may be the future trend of the vehicle signal lamps. From two-dimensional lighting display to three-dimensional lighting display, a trend of development sequentially adopts incandescent lamp (and halogen lamp), LED lamp (direct illumination LED), LED lamp in combination with light diffusion materials, LED lamp of specialized structure, and OLED (organic light-emitting diode) light. Based on the LED lamp of specialized structure, the present disclosure aims to provide LED device of a wide-angle surface light source.

Product features of three conventional light source products for vehicle signal lamps are analyzed as below:

1. Direct Illumination Vehicle Lamp:

Advantages: direct illumination LED lamp can have multiple light sources and high efficiency.

Disadvantages: direct illumination LED light sources are not a uniform light source.

2. Vehicle Lamp of LED in Combination with Light Diffusion Materials:

Advantages: by using LED in combination with light diffusion materials, the quantity of LED used can be reduced.

Disadvantages: the vehicle lamp using LED in combination with light diffusion materials has issues of larger structure and less space for design, due to light intensity attenuation by diffusion materials, and the light diffusion materials cannot be used in a vehicle lamp requiring a greater LED light intensity 3. OLED Vehicle Lamp:

Advantages: OLED has features such as emitting a uniform light, having a lightweight structure, and saving energy and reducing carbon emission.

Disadvantages: limitations and issues of the OLED include low production volume, high cost of a customized light source using OLED light as the cost of using OLED is generally five times higher than that of using a common LED, and OLED has a short life expectancy. OLED, also known as organic light-emitting diode, has organic materials which easily react with oxygen in the environment, thereby gradually reducing an area that emits light, and therefore, an average life expectancy of the OLED is 6,000 hours (an average life expectancy of a LED light source is longer than 20,000 hours), and the overall light intensity thereof is lower.

Regarding the U.S. Pat. No. 8,497,519 related to the uniform surface light source, entitled "BATWING LED WITH REMOTE PHOSPHOR CONFIGURATION", the technical disadvantages disclosed in this specification are as follows: 1. The mold for producing the lens has a limited form, and LED dies are limited to be in a rectangular arrangement and cannot be flexibly adjusted for various types of a customized lamp; 2. The production process is complex and cannot be simplified, and lacks a consideration for the economic value.

Regarding the U.S. Pat. No. 8,382,337, entitled "LIGHTING DEVICE, LIGHT SPREADING PLATE AND METHOD FOR MANUFACTURING THE SAME", the technical disadvantages disclosed in this specification are as follows: 1. This specification does not have a linear arrangement, and is difficult to meet the requirements of appearance of the customized lamp; 2. This specification does not have a better diffusion effect of a wide-angle uniform surface light source; 3. This specification uses more LED dies; 4. When this specification is applied to the vehicle lamp, a uniformity requirement of not visually perceiving a particle light source cannot be satisfied.

Regarding the U.S. Publication No. US-2011-0141729-A1, entitled "RETROFIT-STYLE LAMP AND FIXTURE, EACH INCLUDING A ONE DIMENSIONAL LINEAR BATWING LENS", the technical disadvantages disclosed in this specification are as follows: 1. Embodiments of this disclosure provide a directly replaceable LED tube; 2. LED light source consists of a plurality of single LED components (not a LED die), in a dotted arrangement that are separate from each other; 3. The uniformity of the surface light source is insufficient, and is prone to have disadvantages of a concentrated light intensity; 4. This disclosure is completely unusable in a vehicle lamp usage.

Regarding the U.S. Publication No. US-2015-0036347-A1, entitled "COMPOUND LENS AND LED LIGHT SOURCE DEVICE INCORPORATING THE SAME", the technical disadvantages disclosed in this specification are as follows: 1. The mold for producing the lens has a limited form, and cannot be flexibly adjusted for various types of the customized lamp; 2. The lens is not directly covered upon the LED light source, and a spatial structure is located between the lens and the LED light source, thereby lowering the light-emitting intensity; 3. In this specification, the production process cannot be modularized, and this specification lacks economic value in terms of the manufacturing perspective.

SUMMARY OF THE DISCLOSURE

In response to the above-referenced technical inadequacies, the present disclosure discloses constructs and manufacturing techniques of a surface light source LED device that is a wide-angle surface light source LED device capable of emitting a visually uniform light. The wide-angle surface light source LED device is formed by disposing one or a plurality of LED bar elements on a carrier surface or a circuit board. The LED bar element has a plurality of LED bars disposed therein, each of the plurality of LED bars includes a plurality of LED dies, and the LED dies can be disposed tightly in a straight, arced, or curved arrangement. For achieving a visually uniform light-emitting effect, in principal the LED dies are arranged with an interval no greater than 2 mm. The LED bar has a primary lens structure having features of extremely thin thickness and narrow width.

The wide-angle surface light source LED device emits light along a strip direction (also known as a longitudinal direction), so as to present a visual continuity and uniform distribution. Through the staggered arrangement of the plurality of LED bar elements, an effect of uniform surface light source is presented. Another feature of the lighting device is that, a special primary lens design of the LED bars can be utilized to effectively satisfy the light distribution requirements of lamp application (such as vehicle lamps). For application fields regarding streamlined vehicle lamp design adopting a transparent light guiding plate, in the wide-angle surface light source LED device of the present disclosure, due to the tight arrangement of light-emitting LED dies, a requirement of a more visually uniform light emittance light source can be met. Since the wide-angle surface light source LED device of the present disclosure has the primary lens structure and has features of extremely thin thickness and narrow width, the light emitted therefrom can be effectively incident into the transparent light guiding plate, thereby satisfying the light distribution requirements of the vehicle lamp.

The goals of the present disclosure are not limited to using small size LED dies as a surface light source and proceed to design the primary optics lens to acquire the primary lens structure that is smaller in size, higher in light usage efficiency and precise in control, so that when applying the present disclosure in the field of vehicle lamp, an issue of an excessively wide light strip being unable to match a narrower light guiding plate can be solved, and an issue of an excessively thick light strip being unable to fit into a narrower lamp body space can be solved. The present disclosure can also solve the technical difficulties of being unable to achieve a larger surface light source area with a smaller quantity of LED. Moreover, the present disclosure can also satisfy rules and regulations related to light distribution that request a higher luminosity on a center and peripheral area. The present disclosure provides symmetric illumination patterns, so an excessively large illumination output is not needed. Energy consumption does not become an issue in the present disclosure, nor does a complex design or large size of a heat sink due to excessive energy consumption. The present disclosure also solves an issue of visually uneven distribution of light and shade, or non-uniform surface light source from lamps of existing technologies adopting LED as a light source, and effectively improves and elevates the quality of the lamp body. Therefore, the present disclosure is capable of completely satisfying the market requirements of the vehicle lamp presenting an elevated water clear quality.

In order to achieve the aforementioned goals, the surface light source LED device of the present disclosure includes: a circuit board, at least one power input, and at least two LED bar elements. The circuit board has a connection circuit disposed on an upper layer of the circuit board. The at least one power input is electrically coupled to the circuit board. The at least two LED bar elements are disposed on the circuit board and electrically coupled to the at least one power input. Each of the at least two LED bar elements includes a plurality of LED bars linearly arranged on the circuit board. Each of the plurality of LED bars has a straight strip structure, and includes a plurality of LED dies of the same type disposed therein, the plurality of LED dies are arranged with equal intervals therebetween, the equal intervals are between 0.15 mm and 2.8 mm Intervals between each of the plurality of LED bars are the same as the equal intervals between each of the plurality of LED dies. Each of the plurality of LED bars has a wide-angle lens disposed thereon such that a cross-sectional light-emitting angle of each of the plurality of LED bars is diffused. The wide-angle lens is integrally formed during the molding of each of the plurality of LED bars, and covers upon the plurality of LED dies of each of the plurality of LED bars.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
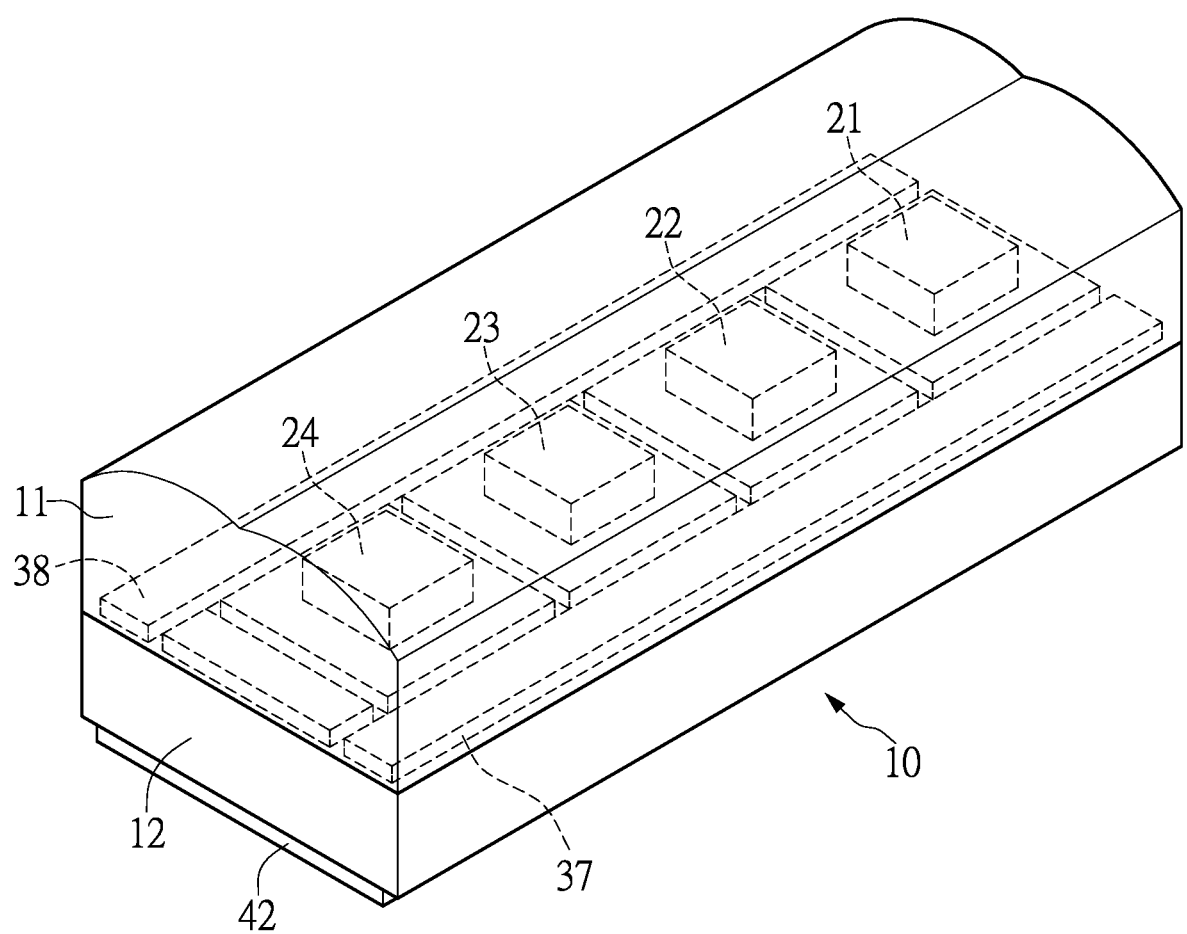
FIG. 1 is a perspective schematic view according to a first embodiment of the present disclosure.

The present disclosure is related to a surface light source LED (light-emitting diode) device that effectively solves visual issues of uneven distribution of light and shade, particle light spots, or insufficient uniform distribution of a surface light source of vehicle lamps adopting LED as the light source. The present disclosure is capable of effectively improving and elevating the quality of a lamp body, and can utilize a structure of plurality of LED dies tightly arranged in a linearly manner according to requirements of design to complete the production of a primary lens and molding structure in conjunction with silicone molding process, and after cutting, different LED bars (also known as LED light strip or LED section) are formed. The present disclosure can also select a variety of suitable LED bars or LED light strips, in conjunction with other necessary electrical components, connector and driving IC (integrated circuit), and mount the LED die on the circuit board selected according to design requirements using SMT (surface-mount technology), thereby completing the production of the wide-angle surface light source LED light-emitting device.

The present disclosure is more particularly described in the following examples that are intended as illustrative only since numerous modifications and variations therein will be apparent to those skilled in the art. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure. In the drawings, sizes and related positions and distances of the LED die, LED bar, LED bar element, LED, circuit board, connector or IC, etc., may be exaggerated for the purpose of clarity, however, like numbers in the drawings indicate like components throughout the views.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Reference is made to FIG. 1, which is a perspective schematic view of a first embodiment of the present disclosure, in which the structure of an LED bar 10 is disclosed, the LED bar 10 includes a substrate 12 and a wide-angle lens 11; and a plurality of die areas and a plurality of electrode areas are arranged on an upper surface of the substrate 12, and a plurality of LED dies are respectively arranged corresponding to the plurality of die areas disposed on the substrate 12. The wide-angle lens 11 is covered upon the plurality of die areas, the plurality of electrode areas and the plurality of LED dies. In practical operation, the substrate 12 may be a printed circuit board (PCB), a flexible printed circuit board (FPCB) or a multilayer printed circuit board, and related descriptions of the plurality of die areas and the plurality of electrode areas will be iterated in detail in FIG. 2A.

In FIG. 1, the wide-angle lens 11 is covered upon a plurality of LED dies 21 to 24 and the substrate 12 (or circuit board). In practical production, the plurality of LED dies 21 to 24 can be tightly arranged in a liner manner on the substrate 12 by using chip on board (COB) process, and form a light strip structure. A variety of suitable LED light strips can also be selected, in conjunction with other necessary electrical components and connector, and mount the LED light strips on the circuit board selected according to design requirements, but the present disclosure is not limited thereto. Afterwards, by using a silicone molding process, production and molding process of the wide-angle lens 11 is completed, and different LED bars 10 are formed by cutting. In practical production, a length of the LED bar 10 can be between 1.8 to 30 mm, the range of the length may be different according to yield, SMT capability, application requirements, and size, quantity and interval of the LED dies. In practice, a width is between 0.7 to 1.9 mm, and a height is between 0.7 to 1.9 mm, according to size of the LED dies and the primary lens. It should be noted that embodiments of the present disclosure are not limited thereto.

Moreover, when implementing the plurality of LED dies 21 to 24, each interval between two adjacent LED dies 21 to 24 fixedly disposed on the substrate 12 (or circuit board) is basically between 0.15 mm to 2.8 mm, and less than 1.9 mm in practical production. The intervals between two adjacent LED dies 21 to 24 are equal intervals. The wide-angle lens 11 has a double-arced appearance and structure on an upper surface thereof, two side faces of a cross-sectional thereof are perpendicular structure, and the wide-angle lens 11 may be a straight strip structure, or a bent strip structure (in conjunction with a bent substrate 12 and form a bent strip structure). The present disclosure can also electrically engage the LED dies 21 to 24 to the substrate 12 by a manner of SMT or wire bonding.

Figure 2A:
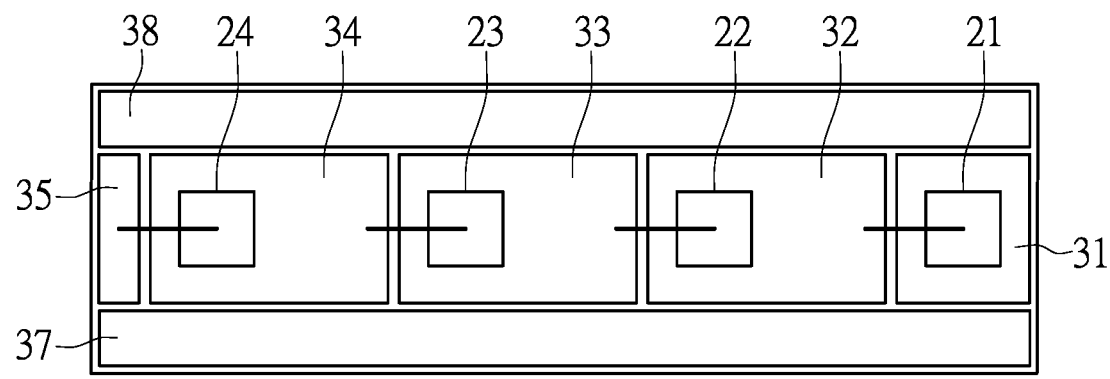
FIG. 2A is a top schematic view of a production structure according to the first embodiment of the present disclosure.
Figure 3:
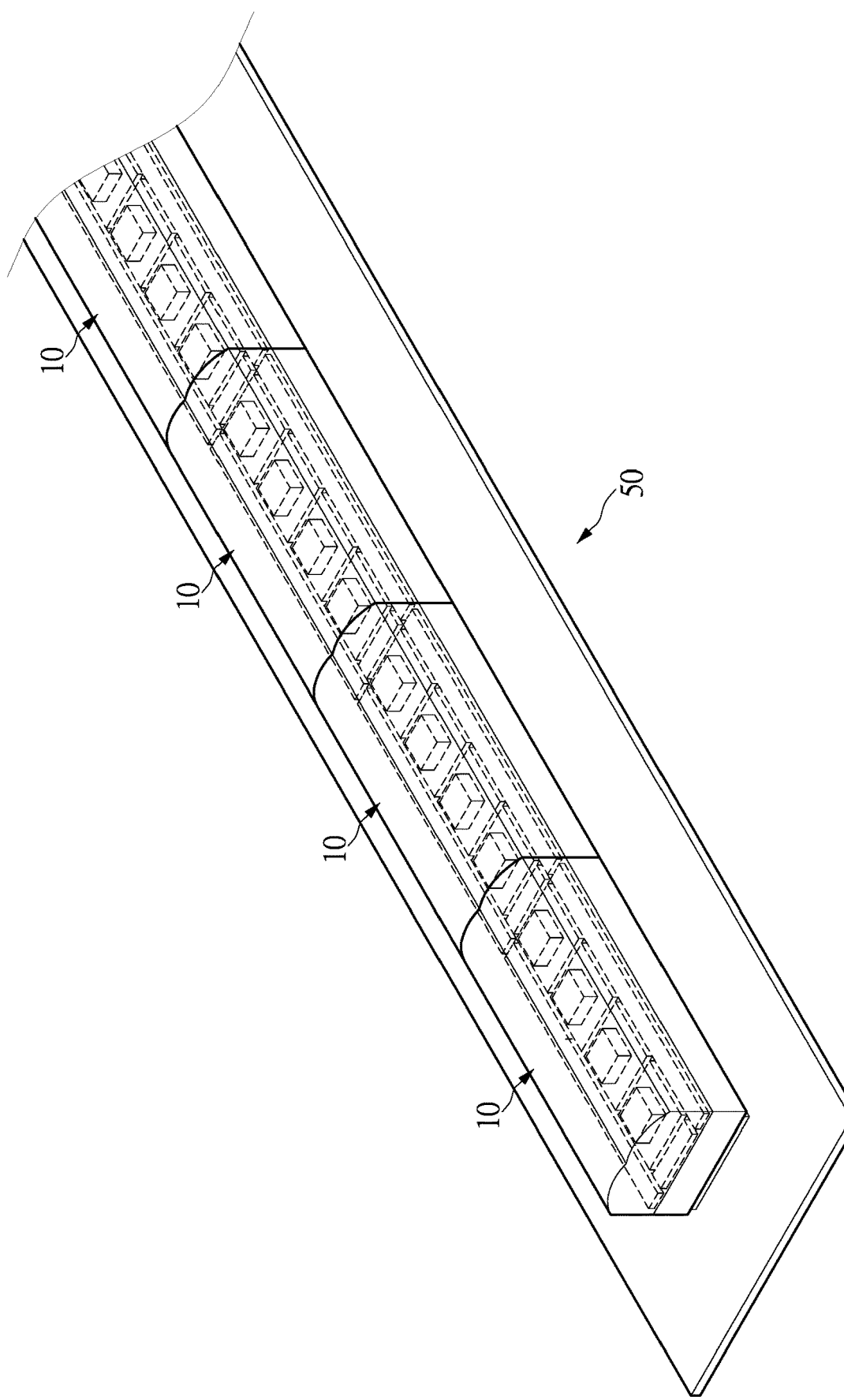
FIG. 3 is a perspective schematic view of a production structure according to a second embodiment of the present disclosure.

Reference is made to FIG. 2A in conjunction with FIG. 1, a LED bar 10 includes the first to fourth LED dies 21 to 24, first to fourth die areas 31 to 34, a first upper electrode area 37, a second upper electrode area 38 and an electrode area 35. The first to fourth LED dies 21 to 24 are simultaneously turned on and lit through an electrical connection in series with the die areas 31 to 34. In one embodiment, the first upper electrode area 37 and the second upper electrode area 38 may be that the first upper electrode area 37 is an anode area, and the second upper electrode area 38 is a cathode area, and the anode area and the cathode area may be an electrode electrical connection area for the LED bars 10 that are adjacent to each other, to facilitate connecting the LED bars 10 in series to form a LED bar element 50 (as shown in FIG. 3). Moreover, through taking the electrode area 35 and the first die area 31 as electrode connecting spots of two adjacent LED bars 10, a circuit designer may easily connect electrodes according to different designs.

It is further learned from FIG. 2A that, an area of the first die area 31 is smaller than that of the second die area 32, the third die area 33, and the fourth die area 34, and an area of the electrode area 35 is further smaller than the first die area 31, the second die area 32, the third die area 33, and the fourth die area 34. In conjunction with the locations in which the first to fourth LED dies 21 to 24 are disposed in the respective die areas 31 to 34, intervals of the two adjacent LED bars 10 can be arranged as the same as the equal intervals between the plurality of LED dies 21 to 24, so that a formation of the plurality of LED bars 10 in a linear arrangement has a light emitting effect of a uniform surface light-emitting effect, thereby avoiding issues of non-uniform light-emitting occurring from adjacent LED bar 10 having different adjacent intervals from the equal intervals of the plurality of LED dies 21 to 24.

Figure 2B:
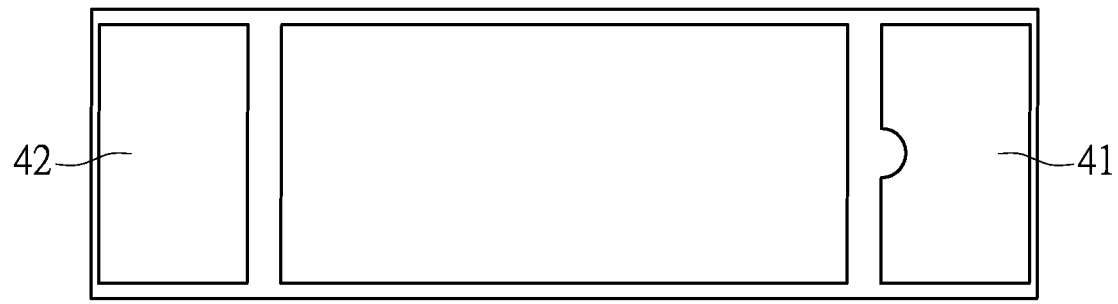
FIG. 2B is a bottom schematic view of the production structure according to the first embodiment of the present disclosure.

As shown in FIG. 2B, in one embodiment, different electrode areas are disposed on a rear side of the substrate 12 (or circuit board), as show in figures, the electrode areas include a first lower electrode area 41 and a second lower electrode area 42. These electrode areas may guide the electrodes on the upper surface of the substrate 12 through a via hole (not shown in figures) to the first lower electrode area 41 and the second lower electrode area 42 of the lower surface, such that the LED bars 10 may connect to other circuits through circuits carried on a bottom side thereof. That is, the LED bars 10 of the present disclosure may be electrically connected to the adjacent LED bars 10 through the electrodes on the upper surface of the substrate 12, and also transmit electrode signals through a lower surface of the substrate 12 and be electrically connected to the adjacent LED bars 10, thereby facilitating a design of circuitry connection.

Figure 2C:
FIG. 2C is a schematic view of a connection represented through electronic symbols according to the first embodiment of the present disclosure.

FIG. 2C is a circuit diagram of corresponding electronic symbols according to a circuit layout structure of FIG. 2A and FIG. 2B, showing that a circuit formed by the first to fourth LED dies 21 to 24 is a LED component in a serial connection.

Further, the wide-angle lens 11 covered upon the first to fourth LED dies 21 to 24 and the substrate 12 (or circuit board) is made by silicone molding, also known as silicone packing, that is, disposing a pillar-shaped mold (not shown in figures) to cover the substrate 12 which has the first to fourth LED dies 21 to 24 disposed thereon, an inside of the pillar-shaped mold has an optical shape for forming the wide-angle lens 11; filling epoxy into the pillar-shaped mold; and after the wide-angle lens 11 is formed, removing the pillar-shaped mold to form a wide-angle surface light source LED device integrally having the wide-angle lens 11 and the substrate 12 as a strip shaped LED light strip, and the plurality of LED dies 21 to 24 are embedded in the wide-angle lens 11. Moreover, an entire strip of pillar-shaped mold may cover a plurality of LED dies of the same kind and type and form a strip-shaped wide-angle lens 11, and the strip-shaped wide-angle lens 11 is then cut into LED bars 10 one by one according to the quantity of LED dies required to be covered in each of the LED bars 10, and the present disclosure is not limited thereto.

Further, to the plurality of LED bars 10, the wide-angle lens 11 of each of the plurality of LED bars 10 covers the plurality of LED dies 21 to 24. That is, each of the plurality of LED bars 10 has the wide-angle lens 11 disposed therein, such that each of the plurality of LED bars 10 can have a diffused cross-sectional light-emitting angle. The wide-angle lens 11 has an integral structure when each of the plurality of LED bars 10 is molded. For the embodiment shown in FIG. 1 of the present closure, four LED dies of the same kind and type are embedded in the wide-angle lens 11 to form a LED bar 10. However, the present disclosure is not limited thereto, and the designer may form the LED bar 10 by having the LED bar 10 covering two, three, or six LED dies of the same kind and type.

Second Embodiment

Reference is made to FIG. 3, which is a perspective view of a structure of the LED bar element 50 of a second embodiment of the present disclosure. The plurality of LED bars 10 are linearly arranged on a carrier platform, the carrier platform may be a circuit board or a flexible circuit board, a plurality of connection wires may be disposed on the flexible circuit board so that the plurality of LED bars 10 may be electrically connected with external control circuits. It should be particularly noted that, intervals between the plurality of the LED bars 10 are the same as the equal intervals between the plurality of LED dies 21 to 24. As shown in FIG. 3, the LED bar element 50 has a strip structure, and the strip structure is a straight strip structure. In practical applications, the LED bar element 50 shown in FIG. 3 is also one of the embodiments of the wide-angle surface light source LED device of the present disclosure.

Third Embodiment

Figure 4:
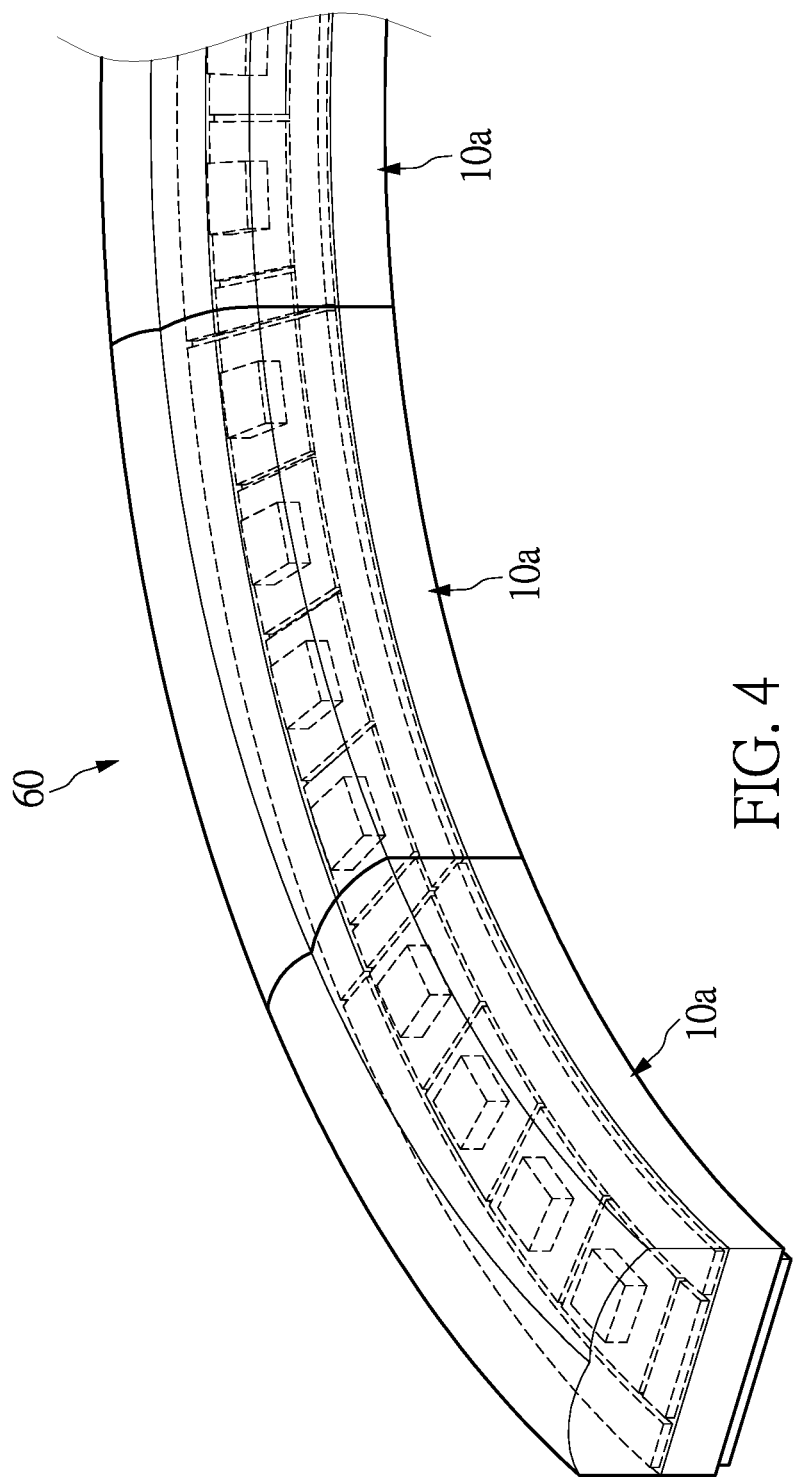
FIG. 4 is a perspective schematic view of a production structure according to a third embodiment of the present disclosure.

Reference is made to FIG. 4, which is a perspective view of a structure of a LED bar element 60 of a third embodiment of the present disclosure. A plurality of LED bars 10a are arranged on a carrier platform in a linear bent (or arced) manner, the carrier platform may be a circuit board or a flexible circuit board, the plurality of connection wires may be disposed on the flexible circuit board so that the plurality of LED bars 10a may be electrically connected with external control circuits. It should be particularly noted that, intervals between the plurality of the LED bars 10a are the same as the equal intervals between the plurality of LED dies 21 to 24. As shown in FIG. 4, the LED bar element 60 has a strip structure, and the strip structure is an arced strip structure. A structural shape of the arced strip structure can be bent along a left or a right direction, can be partially straight and partially bent, and can be continuously bent to present a shape of "S", and the present disclosure does not limit a shape in practical production. The LED bar element 60 having the arced structure includes the plurality of LED dies 21 to 24 disposed on the same plane, that is, the plurality of LED dies 21 to 24 emit light along the same upward direction, and the wide-angle lens 11 is also in a bent and arced shape. In practical applications, the LED bar element 60 shown in FIG. 4 is also one of the embodiments of the wide-angle surface light source LED device of the present disclosure.

Fourth Embodiment

Figure 5:
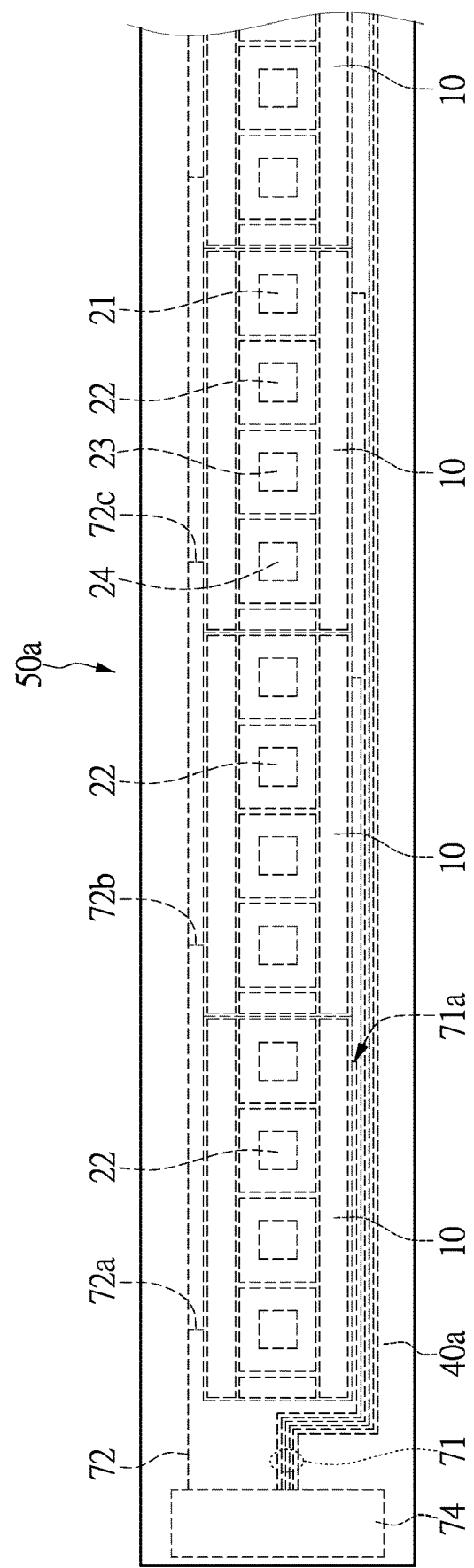
FIG. 5 is a top schematic view according to a fourth embodiment of the present disclosure.

Reference is made to FIG. 5, which is a top view of a structure of a LED bar element 50a of a fourth embodiment of the present disclosure. The LED bar element 50a includes a circuit board 40a. A connector 74, a plurality of connection circuits (the plurality of connection circuits include anode input wires 71, 71a, 71b, and 71c, and cathode input wires 72, 72a, 72b, and 72c) and the plurality of LED bars 10 are disposed on the circuit board 40a in a linear manner, and each of the plurality of LED bars 10 is electrically connected with the connector 74 through the respective connection circuits. An upper electrically conductive layer (a copper foil) of the circuit board 40a has a soldering pad (not shown in figures) and the connection circuits disposed thereon, and are disposed following suggestions and design requirements in the specifications of the components (in this embodiment, only the plurality of LED bars 10 and the connector 74). In this embodiment, powers and control IC that drive the LED are externally disposed (not shown in figures), and external power or signal source are transmitted to the LED device of the fourth embodiment of the present disclosure through the connector 74. In this embodiment, due to the simple design and without additional needs for heat dissipation, the circuit board 40a is a single-layered FR4 PCB, and all anode and cathode input wires 71, 71a, 71b, 71c, 72, 72a, 72b, and 72c are disposed on a front side of the circuit board 40a. In this embodiment, the LED bars 10 use the design of the LED bars 10 from the first embodiment and four LED dies 21 to 24 that are connected in series, such that each of the LED bars 10 only needs to be connected to the power anode input wire 71 and the power cathode input wire 72 to be able to utilize an external input power to simultaneously light the four LED dies 21 to 24 therein, and the connection circuits in the present disclosure include the power anode input wire 71 and the power cathode input wire 72.

In the fourth embodiment, the connector 74 provides a plurality of independent power anode input wires 71 and a shared power cathode input wire 72, such that each of the LED bars 10, based on different designs of the external input power, may be lit individually or simultaneously, or lit alternatingly to meet the requirements of animated lighting. When requirements for other electrical features arise, such as electromagnetic compatibility (EMC), current control or signal transmission, components related to the features, such as capacitor, resistor, inductor and various types of IC may be configured on the circuit board 40a according to design requirements and form another embodiment of the present disclosure (no shown in figures). In practical applications, the LED bar element 50a shown in FIG. 5 is also one of the embodiments of the wide-angle surface light source LED device of the present disclosure.

Fifth Embodiment

Figure 6:
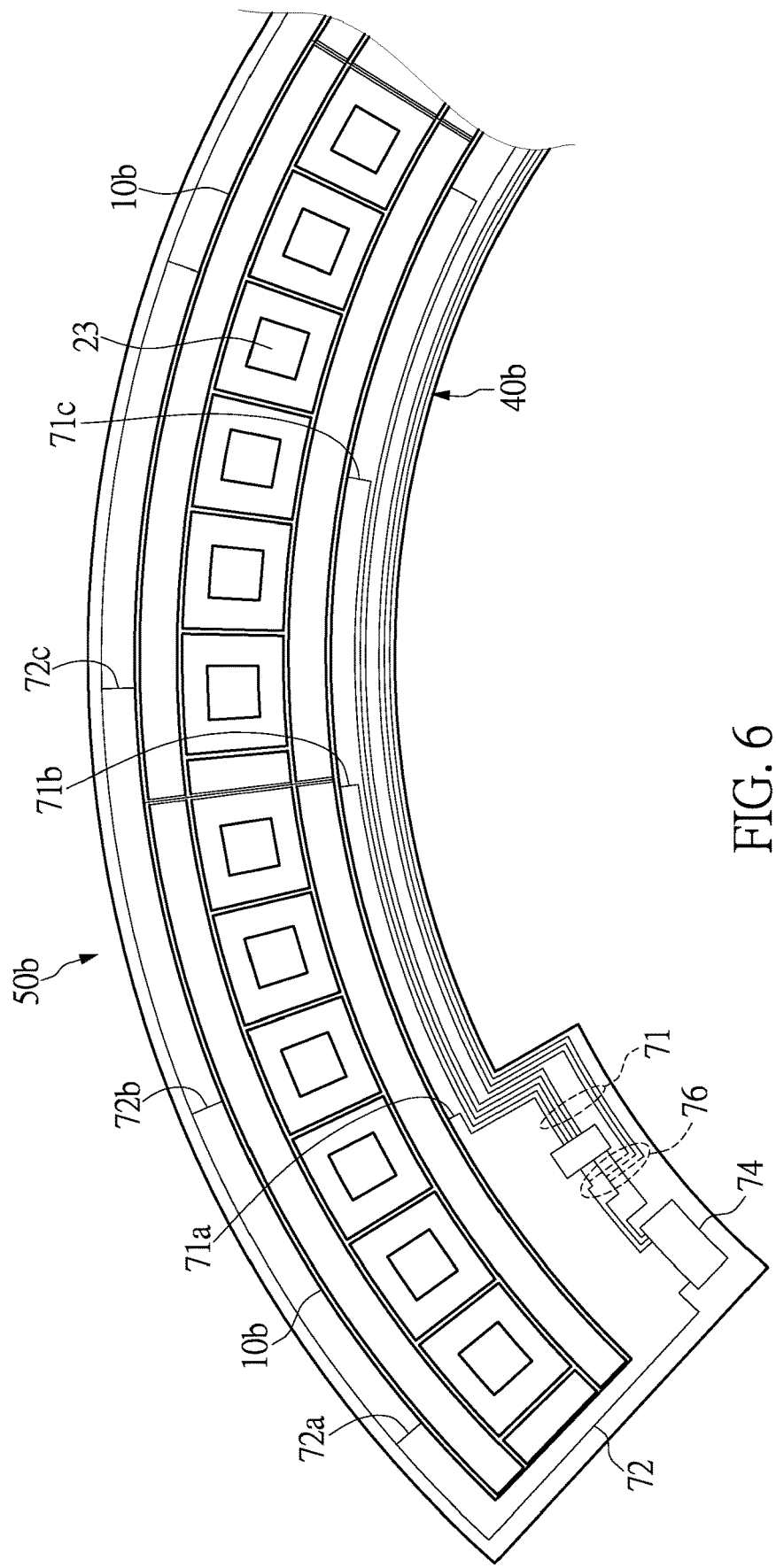
FIG. 6 is a top schematic view according to a fifth embodiment of the present disclosure.

Reference is made to FIG. 6, which is a top view of a structure of a LED bar element 50b of a fifth embodiment of the present disclosure. The LED bar element 50b includes a circuit board 40b. The connector 74, at least one LED driving IC 76, the connection circuits (the connection circuits include anode input wires 71, 71a, 71b, and 71c, and cathode input wires 72, 72a, 72b, and 72c) and the plurality of arced LED bars 10b are disposed on the circuit board 40b in an arced manner, and each of the plurality of LED bars 10b is electrically connected with the LED driving IC 76 through the respective connection circuits. Each of the LED bars 10b includes six LED dies 33, and the present embodiment adopts a circuit design having every three LED dies in serial connection. In the present embodiment, due to a more complex design, the circuit board 40b may be flexible and in an irregular shape, and due to a complex wiring design and requirements of space, the circuit board 40b is a double-layered flexible print circuit board (FPCB), such that a portion of the FPCB having the connector 74 and the LED driving IC 76 disposed thereon may be bent downward for 90 degrees, so as to avoid interruption with a light guiding plate (not shown in figures) during assembly. A bottom layer copper foil of the circuit board 40b provides additional wiring design (as shown by the broken lines of FIG. 6) and heat dissipation, additional heat conductive sticker and aluminum heat sink (not shown in figures) may be added when need for heat dissipation arises. For matching with a light guiding plate (not shown in figures) that is thin and bent, bent LED bars 10b are adopted, which is made in a manner similar to that of the LED bar 10a of FIG. 4. In FIG. 6, each of the LED bars 10b includes six LED dies 33, and adopts a circuit design having every three LED dies in serial connection. The wirings disposed on the circuit board 40b may be utilized, such as two of the anode input wires 71a and 71b, and two of the cathode input wires 72a and 72b, so that each of the LED bar 10b may be lit simultaneously, partially, or alternatingly, and controlled by the LED driving IC 76. The wide-angle surface light source LED device 50b of the present embodiment may be bent downward or upward, and may be partially straight and partially bent, or may be bent continuously in the shape of "S", and the present disclosure is not limited thereto. The present disclosure may also adopt and dispose LED bars of different lengths or bent shapes on a circuit board to produce a wide-angle surface light source LED device that meets lamp applications of light guiding plates of different shapes. In practical applications, the LED bar element 50b shown in FIG. 6 is also one of the embodiments of the wide-angle surface light source LED device of the present disclosure.

Sixth Embodiment

Figure 7:
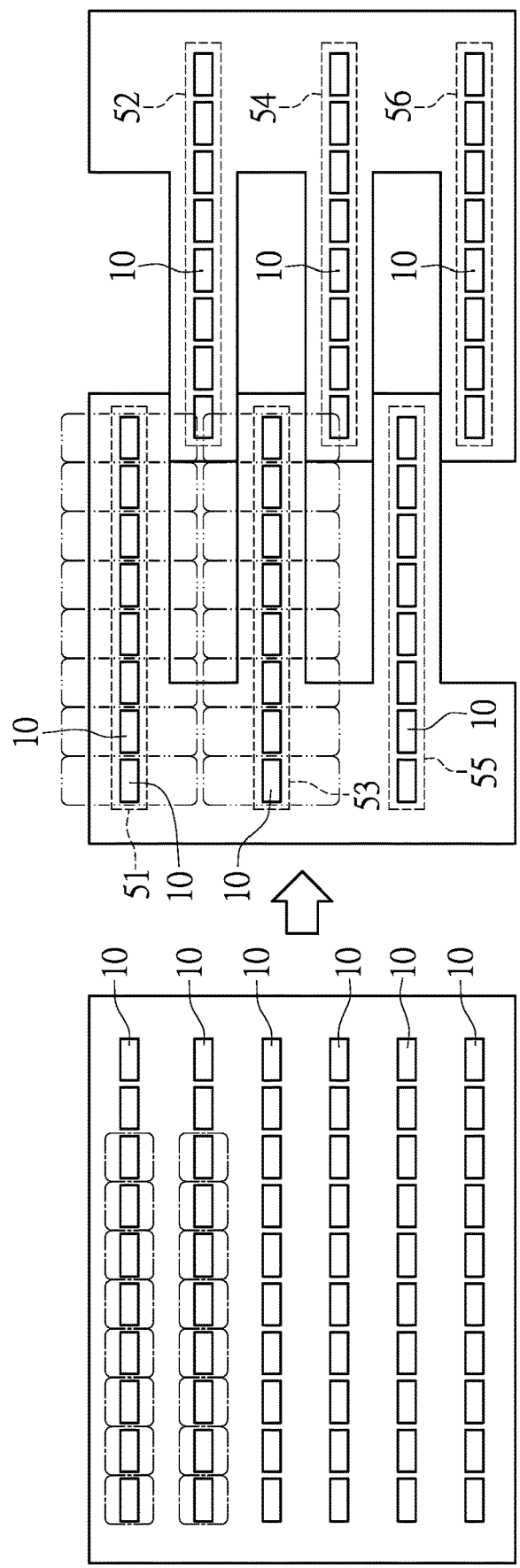
FIG. 7 is a top schematic view according to a sixth embodiment of the present disclosure.

FIG. 7 shows a sixth embodiment of the present disclosure. A staggered arrangement of the plurality of the LED bar elements 50 of FIG. 3 may further diffuse the surface light-emitting effect of the LED device, and the lights emitted are more uniformly distributed, such that the surface light-emitting effect of the LED lamp is improved and is more aesthetic. The plurality of the LED bar elements 50 are staggeringly arranged on a carrier surface (such as bottom surfaces of a plurality of the LED bar elements 51 to 56 of FIG. 7), and the plurality of LED bar elements 51 to 56 having straight strip structures are respectively staggered along front, rear, left, and right directions of each other, thereby forming a uniform surface light source. In FIG. 7, a figure at the left side thereof is an arrangement of LED light sources in a conventional surface light source, and the arrangement is made in an orderly matrix manner, with the LED light sources arranged adjacent to each other. A figure at the right side of FIG. 7 shows the staggered arrangement of the present disclosure, including the first to sixth LED bar elements 51 to 56. Between the first LED bar element 51 and the second LED bar element 52, the rightmost LED bar 10 of the first LED bar element 51 is in line with the leftmost LED bar 10 of the second LED bar element 52, in an top-down adjacency. That is, the first LED bar element 51 and the second LED bar element 52 both extend horizontally, and the top-down adjacent LED bars 10 include the rightmost LED bar 10 of the first LED bar element 51 on top, while the leftmost LED bar 10 of the second LED bar element 52 is at the bottom. In this manner, the third to sixth LED bar elements 53 to 56 are further arranged downward. It can be learned from the comparison made in FIG. 7 that, a uniform light-emitting diffusing effect of the surface light source acquired by the right side embodiment of the present disclosure by staggeringly arranging the first to sixth LED bar elements 51 to 56 is much better than the left side embodiment of the conventional adjacent array arrangement in FIG. 7. In practical applications, a surface light source formed by staggered interval arrangements of the first to sixth LED bar elements 51 to 56 disclosed in FIG. 7 is also one of the embodiments of the wide-angle surface light source LED device of the present disclosure. Moreover, right side figure of FIG. 7 adopts the surface light source LED design of the present disclosure, and left side figure of FIG. 7 adopts the conventional light source LED. Therefore, by using the surface light source LED structure in right side figure, a quantity of LED used can be greatly reduced, while achieving a better effect of uniform surface light source. It can be observed that, the wide-angle surface light source LED device of the present disclosure greatly enhances and improves the technical features.

Seventh Embodiment

Figure 8:
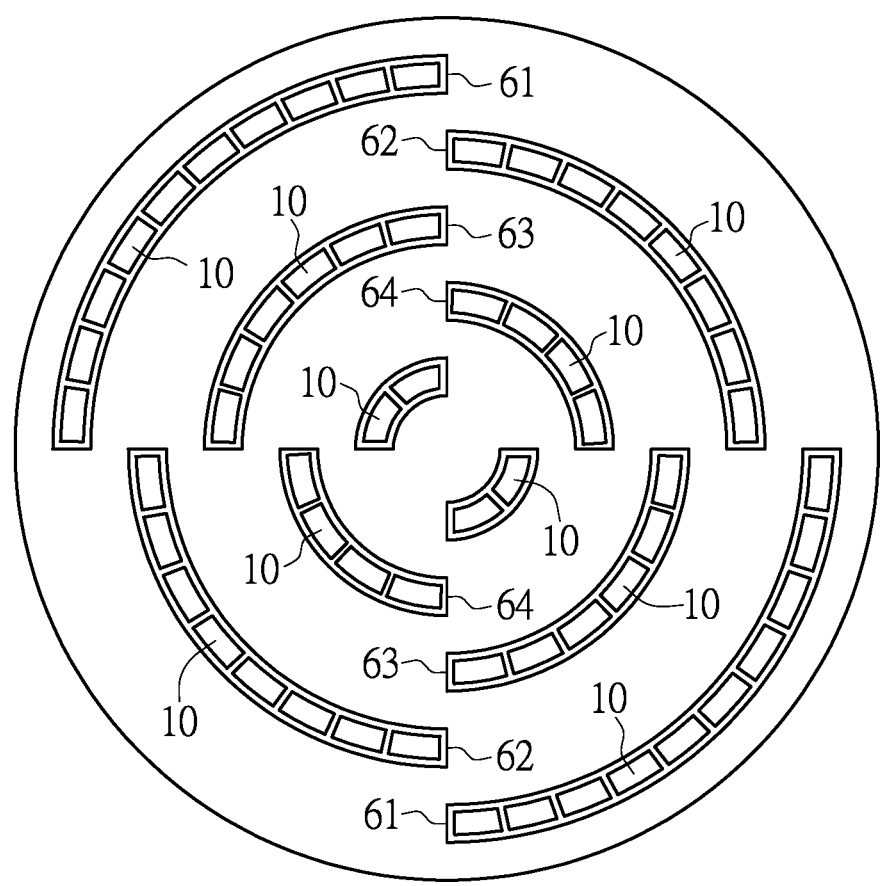
FIG. 8 is a top schematic view according to a seventh embodiment of the present disclosure.

FIG. 8 shows a seventh embodiment of the present disclosure. A staggered arrangement of the plurality of the arced lined (or arced) LED bar elements 50b and 60 of FIG. 4 and FIG. 6 in an arced strip shape forms a circular uniform light-emitting LED surface light source, and may diffuse the circular surface light-emitting effect of the LED light device, and the lights emitted are more uniformly distributed, such that the circular surface light-emitting effect of the LED lamp is improved and is more aesthetic. The plurality of the LED bar elements 50b and 60 in an arced strip shape are mainly staggeringly arranged on a carrier surface (such as bottom surfaces of a plurality of the LED bar elements 61 to 64 of FIG. 8). The plurality of the LED bar elements 61 to 64 are paired and symmetrically arranged, two of the LED bar elements are further in a staggered arrangement, such as being respectively staggered along front, rear, left, right, up, and down directions of each other, thereby forming a circular uniform surface light source. FIG. 8 includes the first to fourth LED bar elements 61 to 64, and the LED bar elements 61 to 64 are disposed in pairs, for example, two of the first LED bar elements 61 are disposed, and two of the second LED bar elements 62 are disposed. The two of the first LED bar elements 61 are respectively disposed on two edges of a circular arc and are arranged symmetrically. The two of the second LED bar elements 62 are staggered along front, rear, up, and down directions of the two of the first LED bar elements 61. The two of each of the LED bar elements 61, 62, 63, and 64 are arranged from a center of a circle, and gradually expanded outward according to different arc line lengths, and staggeringly arranged from the fourth LED bar elements 64 of a smaller arc length to the first LED bar elements 61 of a longer arc length.

Between the first LED bar element 61 and the second LED bar element 62, the rightmost outer edge of the first LED bar element 61 is in line with the leftmost outer edge of the second LED bar element 62, and is arranged in a top-down adjacent manner with an interval therebetween. That is, the first LED bar element 61 and the second LED bar element 62 are respectively arranged toward an outer side of the circular arc. Following the same arrangement, that is, by staggeringly arranging with interval on the carrier surface in a symmetric manner, a uniform circular light source is formed, and the third and fourth LED bar elements 63 and 64 are further arranged inward. It can be learned from FIG. 8 that, the seventh embodiment of the present disclosure presenting the first to fourth LED bar elements 61 to 64 in staggered arrangement can acquire a better diffusing effect of a uniform light emitting of a surface light source than a surface light-emitting diffusing effect from a common adjacent circular array arrangement. In practical applications, the surface light source formed by a staggered interval arrangement shown in FIG. 8 is also one of the embodiments of the wide-angle surface light source LED device of the present disclosure. It can be observed that, the wide-angle surface light source LED device of the present disclosure greatly enhances and improves the technical features.

Eighth Embodiment

Figure 9A:
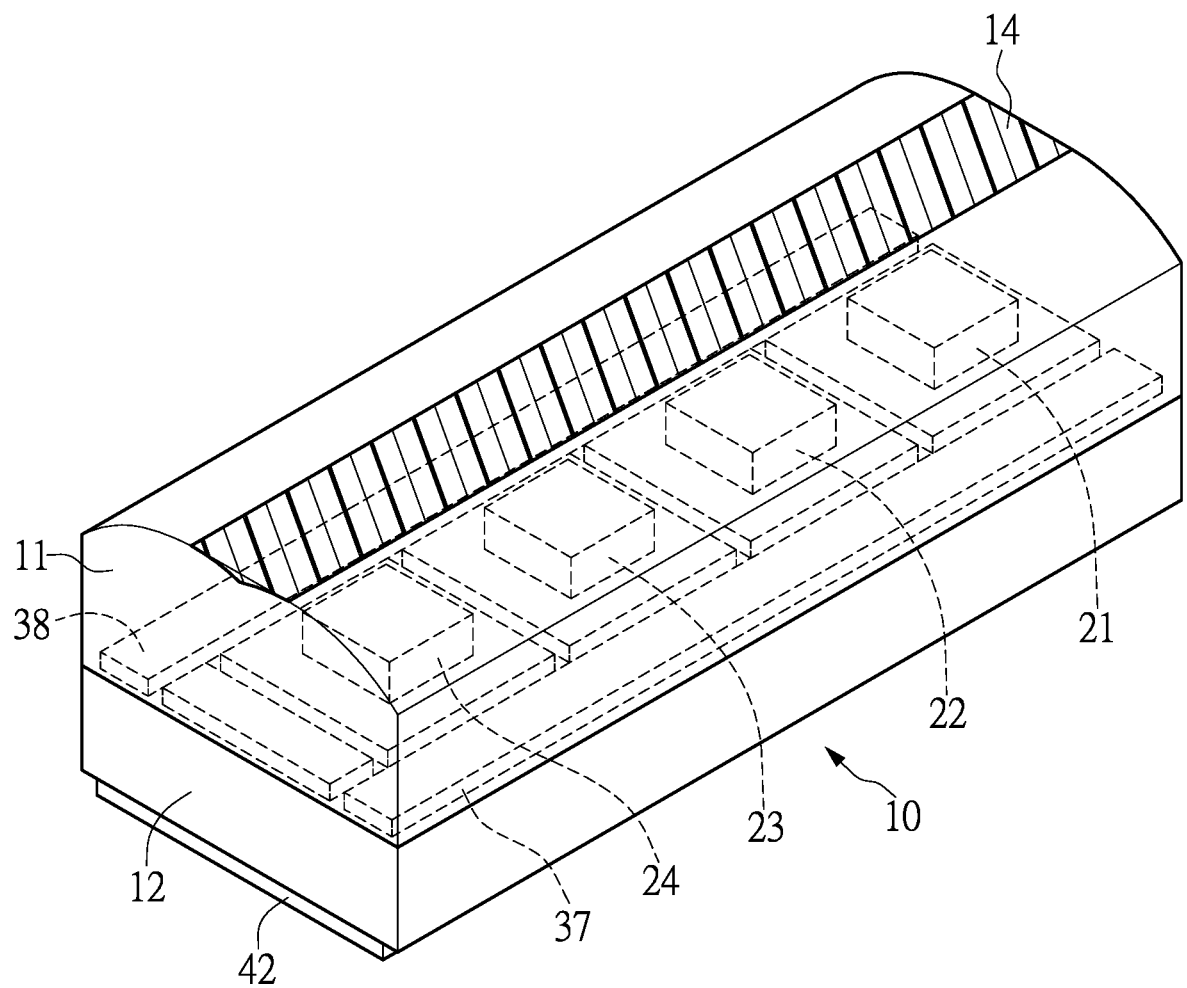
FIG. 9A is a perspective schematic view according to an eighth embodiment of the present disclosure.

Reference is made to FIG. 9A, where the LED bar 10 of an eighth embodiment is shown. A difference between the LED bar 10 of the eighth embodiment and that of the first embodiment shown in FIG. 1 is that a high reflection optical structure 14 is disposed on the LED bar 10 of the eighth embodiment. The high reflection optical structure 14 is disposed on the double-arced upper surface of each of the wide-angle lens 11. The high reflection optical structure 14 has a strip structure and covers upon the middle crease of the double-arced upper surface. A length of the high reflection optical structure 14 is the same as a length of the wide-angle lens 11, and a width of the high reflection optical structure 14 is smaller than a distance between two peaks of the double-arced upper surface in the embodiments disclosed in FIG. 9A.

Ninth Embodiment

Figure 9B:
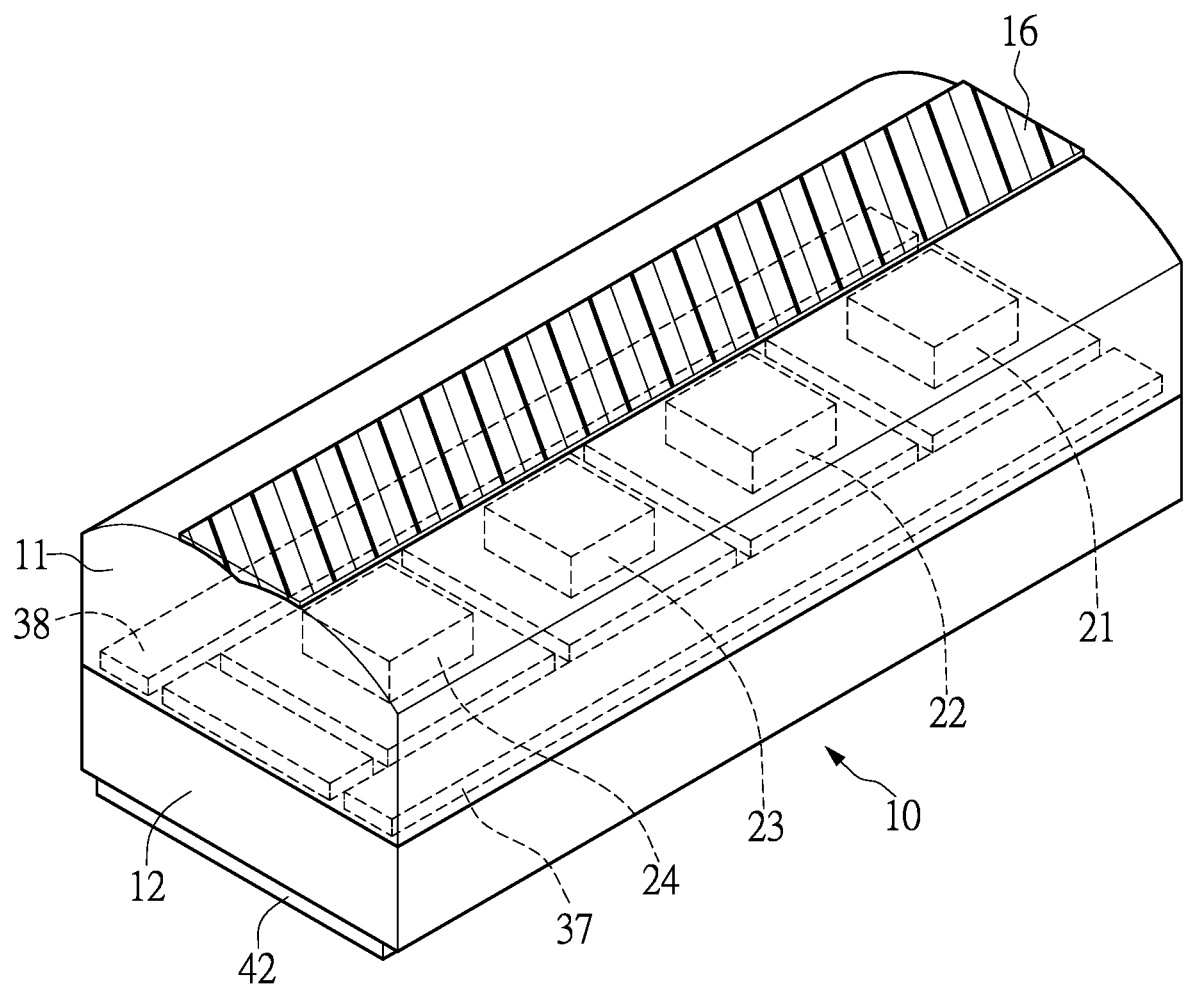
FIG. 9B is a perspective schematic view according to a ninth embodiment of the present disclosure.

On the other hand, a structure of the LED bar 10 of a ninth embodiment of the present disclosure disclosed in FIG. 9B is different from the eighth embodiment shown in FIG. 9A. The difference is that a width of a high reflection optical structure 16 of FIG. 9B in the embodiment disclosed in FIG. 9B is equal to a distance between the two peaks of the double-arced upper surface.

Tenth Embodiment

Figure 10A:
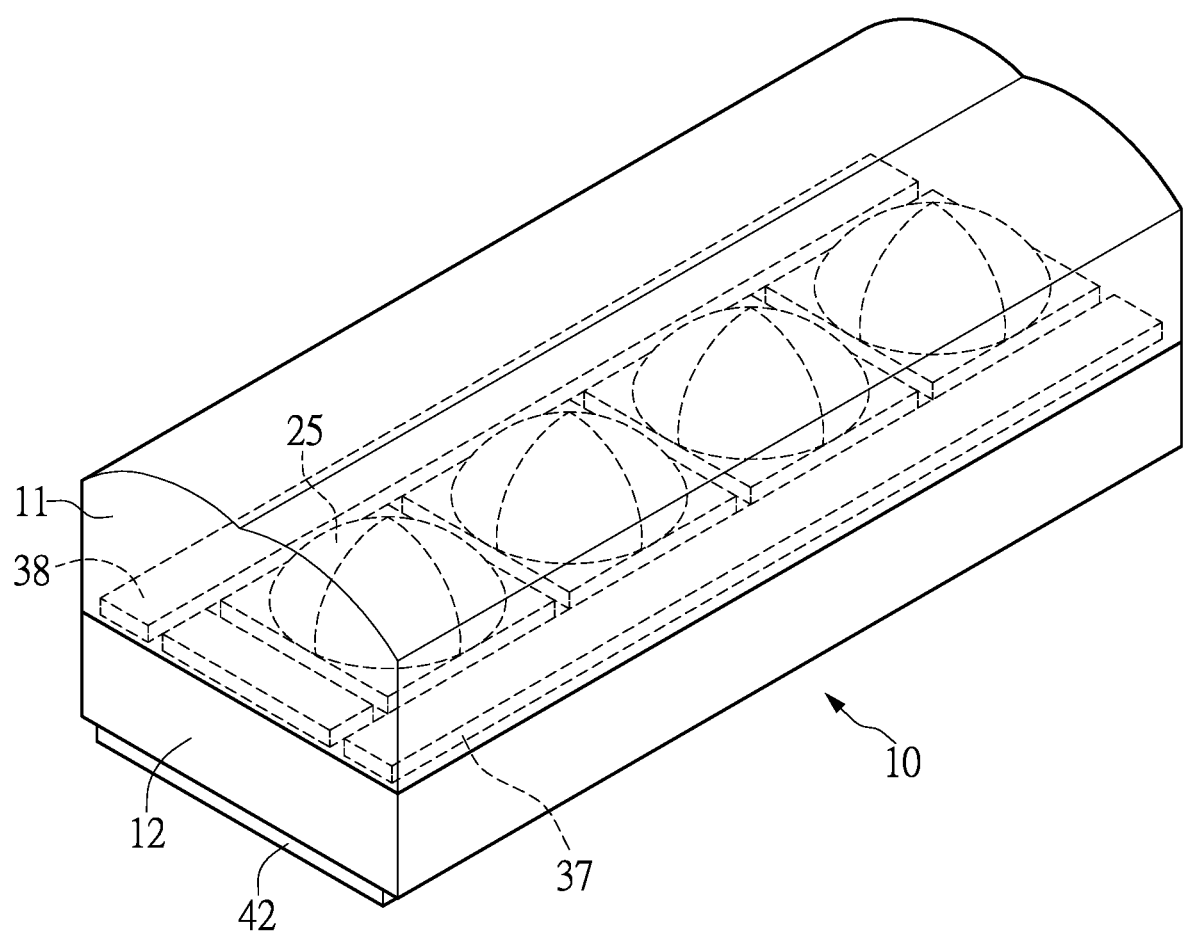
FIG. 10A is a perspective schematic view according to a tenth embodiment of the present disclosure.

Reference is made to FIG. 10A, which is a perspective view of the LED bar 10 in a tenth embodiment of the present disclosure. A difference between the LED bar 10 of the tenth embodiment and that of the first embodiment shown in FIG. 1 is that, the LED bar 10 of the tenth embodiment has a phosphor material 25 disposed directly above each of the LED dies 21 to 24, and between each of the LED dies 21 to 24 and the wide-angle lens 11, so that the LED bar 10 emits white light through the phosphor material 25. That is, in the sixth and seventh embodiments disclosed by FIGS. 7 and 8, if the LED bar 10 of FIG. 10A that emits white light is adopted, then FIGS. 7 and 8 may have LED surface light sources that emit white and uniform surface light, and have an aesthetic and simple appearance.

Eleventh Embodiment

Figure 10B:
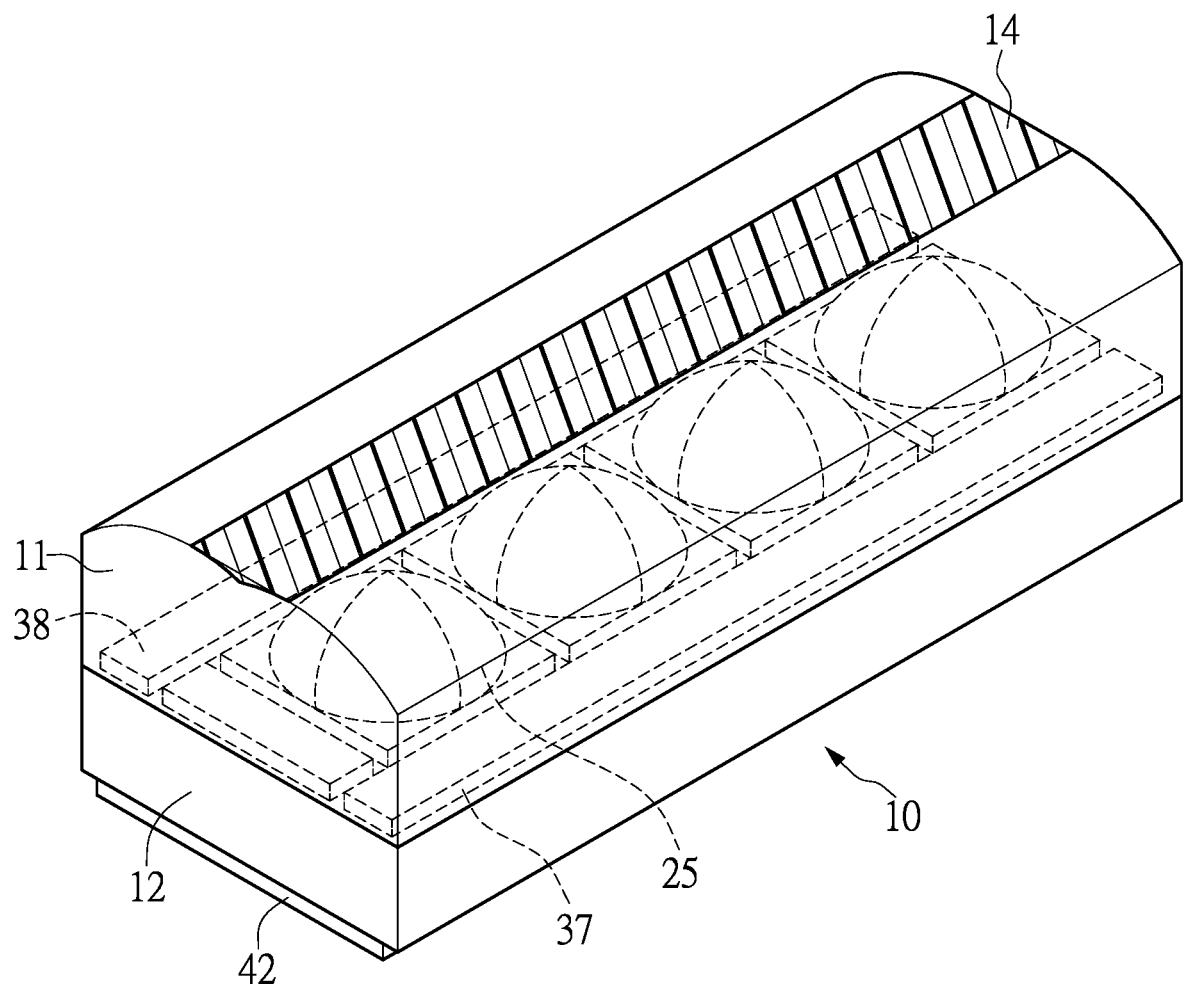
FIG. 10B is a perspective schematic view according to an eleventh embodiment of the present disclosure.

Reference is made to FIG. 10B, which is a perspective view of the LED bar 10 in an eleventh embodiment of the present disclosure. A difference between the LED bar 10 of the eleventh embodiment and that of the tenth embodiment shown in FIG. 10A is that a high reflection optical structure 14 is disposed on the LED bar 10 of the eleventh embodiment. The high reflection optical structure 14 is disposed on the double-arced upper surface of each of the wide-angle lens 11. The high reflection optical structure 14 has a strip structure and covers upon the middle crease of the double-arced upper surface. A length of the high reflection optical structure 14 is the same as a length of the wide-angle lens 11, and a width of the high reflection optical structure 14 is smaller than a distance between the two peaks of the double-arced upper surface in the embodiments disclosed in FIG. 10B. Further, a phosphor material 25 is disposed directly above each of the LED dies 21 to 24, and between each of the LED dies 21 to 24 and the wide-angle lens 11, so that the LED bar 10 emits white light through the phosphor material 25.

Twelfth Embodiment

Figure 10C:
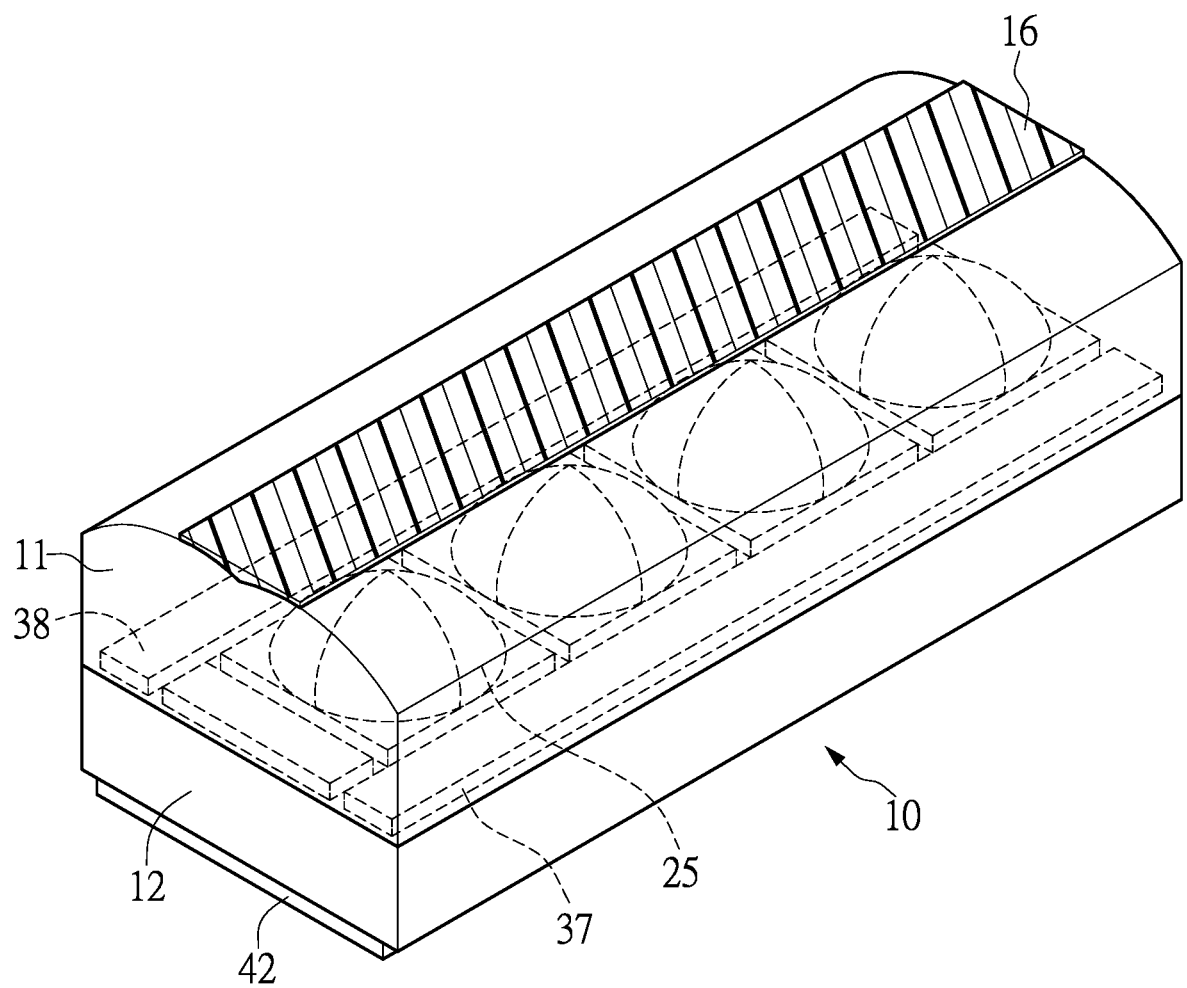
FIG. 10C is a perspective schematic view according to a twelfth embodiment of the present disclosure.

A structure of the LED bar 10 of a twelfth embodiment of the present disclosure disclosed in FIG. 10C is different from the eleventh embodiment shown in FIG. 10B. The difference is that a width of a high reflection optical structure 16 of FIG. 10C in the embodiment disclosed in FIG. 10C is equal to a distance between the two peaks of the double-arced upper surface. Likewise, a phosphor material 25 is disposed directly above each of the LED dies 21 to 24, and between each of the LED dies 21 to 24 and the wide-angle lens 11, so that the LED bar 10 emits white light through the phosphor material 25.

Figure 11A:
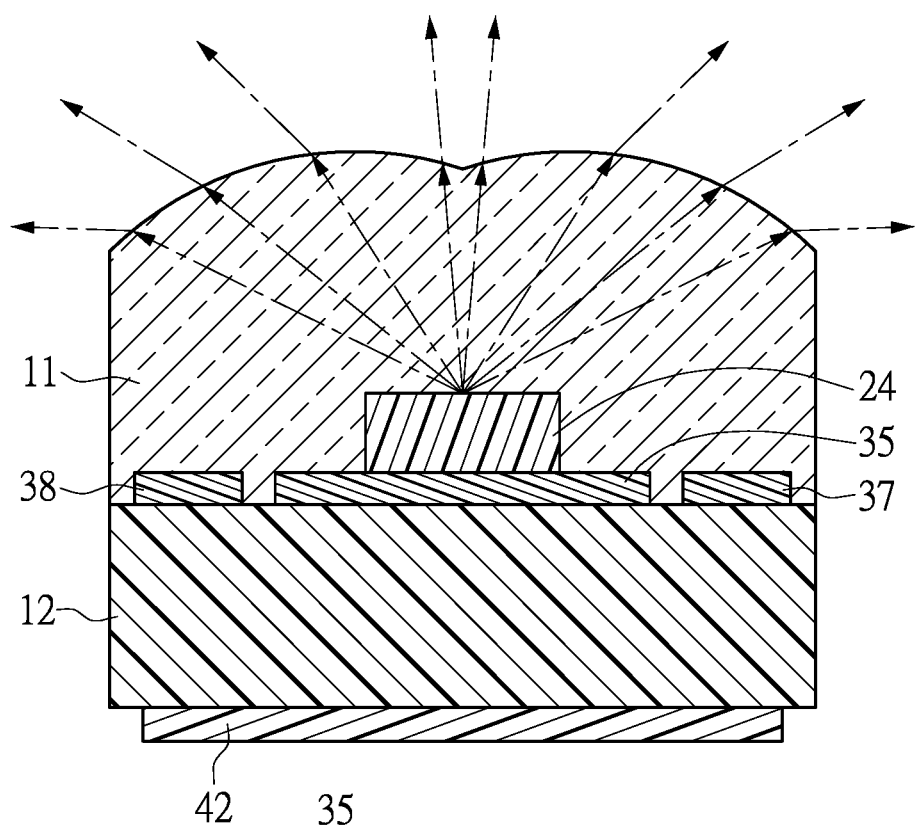
FIG. 11A is a schematic view representing the first embodiment of the present disclosure in a light-emitting state.
Figure 11B:
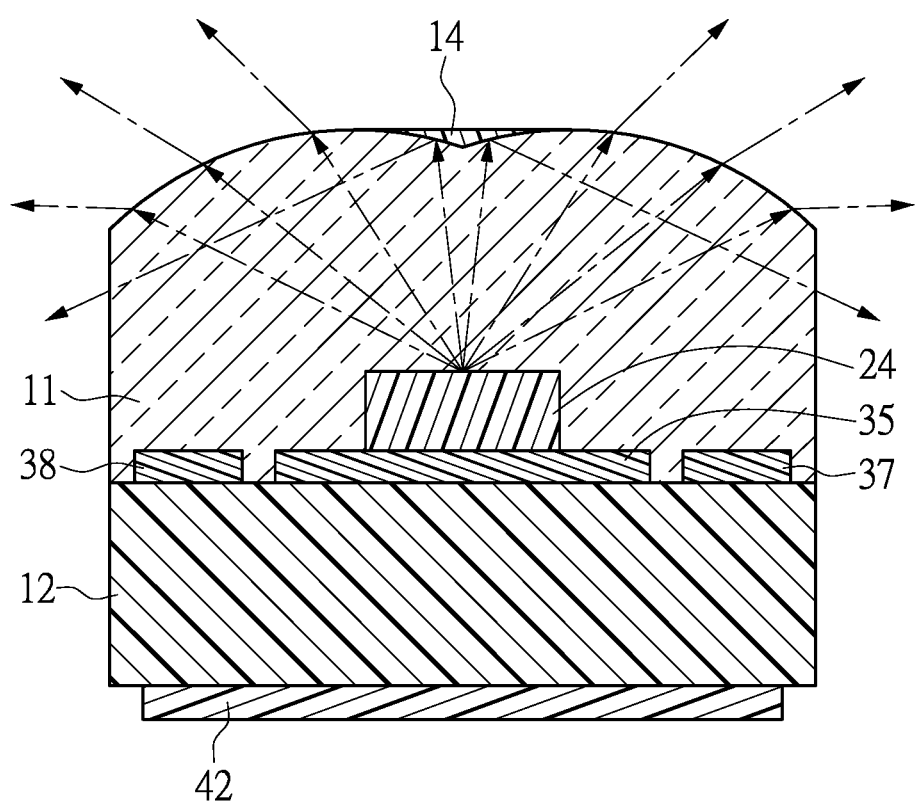
FIG. 11B is a schematic view representing the eighth embodiment of the present disclosure in a light-emitting state.
Figure 11C:
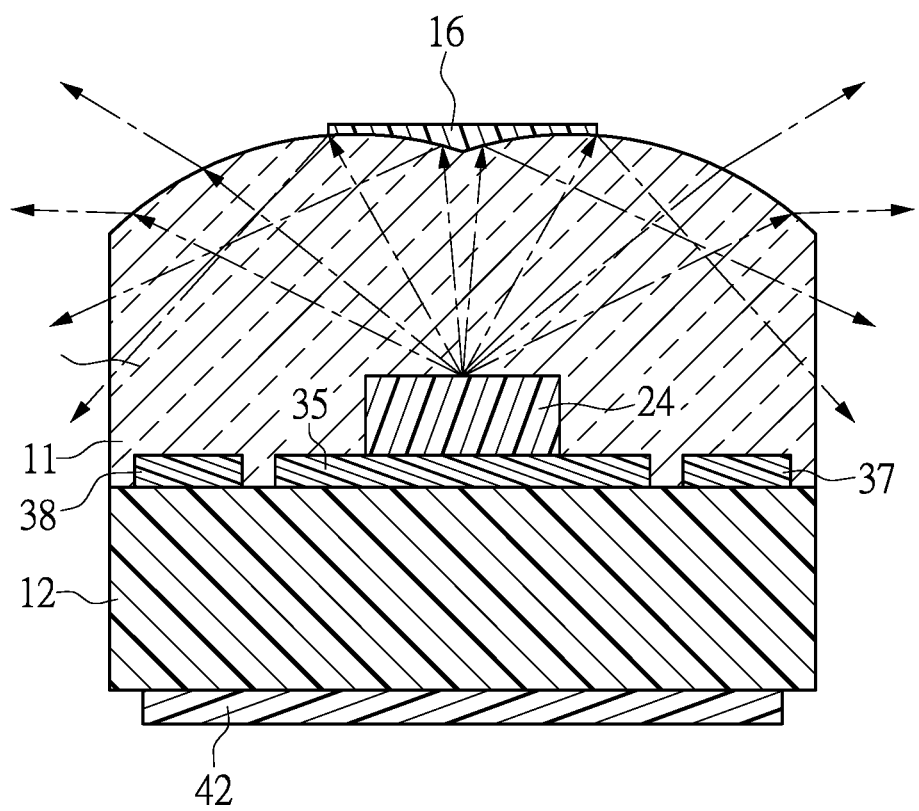
FIG. 11C is a schematic view representing the ninth embodiment of the present disclosure in a light-emitting state.

FIGS. 11A to 11C are schematic views of light-emitting angles of LED bar 10 having different types and constructs of high reflection optical structure in the first, eighth and ninth embodiments. By utilizing shapes of the upper surface of the wide-angle lens 11 and the optical refraction and reflection increased by the high reflection optical structure 14 and 16, the three (the first, eighth and ninth embodiments) types of LED bars 10 can have different light-emitting effects. Generally, according to different structures, common LED structures have a viewing angle of between 120 and 140 degrees. However, among the embodiments of the present disclosure, in a computer optical simulation and analysis, the viewing angle of the embodiment shown in FIG. 11A is 161.75 degrees, the viewing angle of the embodiment shown in FIG. 11B is 163.07 degrees, and the viewing angle of the embodiment shown in FIG. 11C is 164.12 degrees.

In the present disclosure, the length (the length of the substrate 12 after being cut) and curvature (the shape of the substrate 12 after being cut) of a LED bar 10 may be determined according to design requirements (including functions, SMT, and requirements regarding assembly and cost). Regarding the length of LED bars 10, for example, the length is smaller than 2 mm if two LED dies are molded; the length is smaller than 5 mm if four LED dies are molded; the length is smaller than 9 mm if eight LED dies are molded; the length is smaller than 214 mm if twelve LED dies are molded; it should be particularly noted that, the present disclosure is not limited thereto. Specific designs of the layout and circuit design of an upper electrically conductive layer of the substrate 12 are completed in advance according to design requirements of various types of the LED bars 10. According to design requirements, soldering leads of one of the LED bars 10 are disposed in a bottom layer of the substrate (or circuit board) and are in electrical communication and connection with the upper layer of the substrate or other layers through via holes (not shown in figures). Further, the substrate or the circuit may be a thin FR4 board, a BT board, a metal PCB substrate or a ceramic PCB substrate. Considering that the LED dies may require heat dissipation, when necessary, the substrate of the LED bar can have thermal via holes disposed thereon.

When the surface light source LED device of the present disclosure is adopted in a lamp that has a structure of having light sources on the same plane, according to a design requirement of a designer, a surface light source is selected from various rectangular LED surface light sources or circular LED surface light sources made according to the design requirement, and of appropriate area and size. The surface light sources that are capable of being configured and assembled into different geometric shape and area may be mounted by using the SMT process in conjunction with necessary electrical components and connectors to a circuit board selected according to a design requirement to complete the production of the wide-angle surface light source LED device. Moreover, when the surface light source LED device of the present disclosure is adopted in a lamp that is partially or entirely in geometric shapes, and when the light sources are on the same plane, according to a design requirement of a designer, a surface light source is selected from surface light source LED devices or LED light of various geometric shapes and/or LED lamp or LED light sections that are made according to the design requirement, and of various irregular area, and mounted by using the SMT process in conjunction with necessary electrical components and connectors to a circuit board selected according to a design requirement to complete the production of a lamp of irregular area and shape. Furthermore, when the surface light source LED device of the present disclosure is adopted in a lamp of a partial irregular shape and having light sources not on the same plane, for portions including light sources not on the same plane, a wide-angle surface light source LED device with the shortest length (e.g., LED bar having only one or two LED dies) may be selected, and portions including light sources on the same plane may have appropriate LED bars selected as in the aforementioned two options, and mount the appropriate LED bars by using the SMT process in conjunction with necessary electrical components and connectors to a flexible printed circuit board (FPCB) selected according to a design requirement to complete the production of a bent-shaped light strip.

Furthermore, the present disclosure adopts LED bar elements 50, 50*a*, 60, and 60*a* that emit different color lights. For example, in the embodiment shown in FIG. 7, the first, third and fifth LED bar elements 51, 53 and 55 adopt LED dies that emit yellow light, while the second, fourth, and sixth LED bar elements 52, 54, and 56 adopt LED dies that emit red light, so that the wide-angle surface light source LED device disclosed in FIG. 7 may emit surface light source of two different colors. Likewise, in the embodiment shown in FIG. 8, the first and third LED bar elements 61 and 63 adopt LED dies that emit yellow light, while the second and fourth LED bar elements 62 and 64 adopt LED dies that emit red light, so that the circular wide-angle surface light source LED device disclosed in FIG. 8 may emit surface light source of two different colors. That is, LED bars emitting a first color light are arranged on a circuit board or a carrier surface in a linear or arced manner, and LED bars emitting a second color light are arranged on the circuit board or the carrier surface in another linear or arced manner, and the LED bars emitting the first color light and the LED bars emitting the second color light are arranged on the circuit board or the carrier surface in a mutually parallel or alternatingly symmetric manner.

Furthermore, when the surface light source LED device of the present disclosure adopts a lamp or a carrier that has two color light types, two LED bars emitting different colors are made according to a manner of production and requirements of various light types of the aforementioned LED bar elements 50, 50*a*, 60, and 60*a*, and are assembled to a shared carrier or heat sink in a parallel or symmetric manner. One of the LED dies or LED bars may be controlled through a microchip IC, and be alternatingly lit, such that an animated function of the vehicle lamp may be satisfied and aesthetic and unique effects may be added to the vehicle lamp.

In the surface light source LED device of the present disclosure, through the design of primary optics lens and a layout design of the overall LED bar 10, an effect of light-emitting angle expansion may be achieved. By utilizing related optical structure of lens, staggered arrangement of the LED bar elements, and the excellent light-emitting effect of the LED bars 10, the LED surface light source may have an excellent uniformity in light-emitting. In the computer optical simulation and analysis, the first, eighth, and ninth embodiments of the present disclosure show that, by using the optical structure of lens in conjunction with the strip structure of the LED bars 10, a light-emitting angle may be effectively widened. Although an optical structure generally decreases light intensity, a structural design of the present disclosure may effectively increase uniformity and light-emitting angle of the surface light-emitting. Therefore, the present disclosure may overcome the technical difficulty of the disability for a less quantity of LED to achieve a larger surface light source area.

In conclusion, a surface light source LED device of the present disclosure provides LED bars 10 of a thin thickness, a narrow width and a large light-emitting angle, and LED light sources molded using a plurality of LED dies 21 to 24 having a wide-angle lens 11 as a primary optical light distribution lens may be the plurality of LED bars or LED sections. Moreover, the plurality of LED bars (straight LED bars or bent LED bars) may be utilized to assemble LED bar elements 50 and 60, which are then mutually arranged staggeringly into a LED device that has a wide-angle surface light source with area diffusing effect. The LED device is then mounted to an appropriate PCB by using surface adhering SMT process, and a surface light source LED light-emitting device with highly effective light distribution and small size is produced, thus acquiring a new product that is better than existing technologies in aspects of performance and cost. The present disclosure also effectively solves the issues of visually uneven distribution of light and shade, particle light spots, or non-uniform surface light source of lamps of existing technologies that adopt LED as a light source. The present disclosure is capable of effectively improving and elevating the quality of a lamp body, and may acquire a primary lens structure that is small in size, high in light usage efficiency and precise in control, and is capable of being effectively adopted to the field of vehicle lamps. The technical contents of the present disclosure are strongly suitable for patent application.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A surface light source LED (light-emitting diode) device, comprising:
    a circuit board having an connection circuit disposed on an upper layer of the circuit board;
    at least one power input electrically coupled to the circuit board; and
    at least two LED bar elements disposed on the circuit board and electrically coupled to the at least one power input; wherein each of the at least two LED bar elements includes a plurality of LED bars linearly arranged on the circuit board; each of the plurality of LED bars has a straight strip structure, and includes a plurality of LED dies of the same type disposed therein, the plurality of LED dies are arranged with equal intervals there between, the equal intervals are between 0.15 mm and 2.8 mm;
    wherein intervals between each of the plurality of LED bars are the same as the equal intervals between each of the plurality of LED dies; each of the plurality of LED bars has a wide-angle lens disposed thereon such that a cross-sectional light-emitting angle of each of the plurality of LED bars is diffused; and wherein the wide-angle lens is integrally formed during the molding of each of the plurality of LED bars, and covers upon the plurality of LED dies of each of the plurality of LED bars;
    wherein each one of the wide-angle lens of the plurality of LED bars has an upper surface, the cross section of the upper surface is a double-arced shape, the two sides surfaces of the wide-angle lens are perpendicular shape, and the wide-angle lens is in a strip structure;
    wherein a high reflection optical structure is disposed on each one of the upper surface of the wide-angle lens, the high reflection optical structure has a strip structure and covers upon the middle crease of the double-arced shape, a length of the high reflection optical structure is the same as a length of the wide-angle lens.

2. The surface light source LED device according to claim 1, wherein each of the at least two LED bar elements is in a strip structure, and the strip structure has a straight strip structure.

3. The surface light source LED device according to claim 2, wherein the at least two LED bar elements are a plurality of LED bar elements disposed on a carrier surface, a first staggered arrangement between each one of the plurality of LED bar elements is staggered disposed for each other, and wherein the first staggered arrangement of the plurality of LED bar elements that are in a strip structure is arranged to be having each of the plurality of LED bar elements respectively staggered along front, rear, left, and right directions of each other, thereby forming a uniform surface light source.

4. The surface light source LED device according to claim 2, wherein each of the at least two LED bar elements is in a strip structure, and the strip structure is an arced strip structure, wherein an arced length of two of the plurality of LED bar elements are the same, and another two of the plurality of LED bar elements have another arced length, and wherein by different arced lengths, two of the plurality of LED bar elements having the same arced length are sequentially arranged apart diagonally and symmetrically on a carrier surface, a second staggered arrangement between the different arced lengths of the plurality of LED bar elements is staggered disposed for each other, the second staggered arrangement of the plurality of LED bar elements that are in an arced strip structure is arranged to be having each of the plurality of LED bar elements respectively staggered along front, rear, left, and right directions of each other, and thereby forming a uniform circular surface light source.

5. The surface light source LED device according to claim 1, wherein a width of the high reflection optical structure is equal to or smaller than a distance between the two peaks of the double-arced upper surface.

6. The surface light source LED device according to claim 1, wherein the circuit board is a bendable circuit board or a flexible circuit board, and wherein all or part of the plurality of LED bars include shorter LED bars that are constituted by the plurality of LED dies of the same type but of less quantity such that a wide-angle surface light source LED device is bendable.

7. The surface light source LED device according to claim 1, wherein the plurality of LED dies of the same type in each of the plurality of LED bars are connected in series so that the plurality of LED dies of the same type in the plurality of LED bars are lit simultaneously.

8. The surface light source LED device according to claim 1, wherein each of the plurality of LED bars is independently connected with the power input through the connection circuit, such that each of the plurality of LED bars is respectively lit according to the control of external power or signal source, and presents an effect of animated lighting.

9. The surface light source LED device according to claim 1, wherein a phosphor material is coated between each of the LED dies of the plurality of LED bars and the wide-angle lens.

10. The surface light source LED device according to claim 1, wherein each of the plurality of LED bars is electrically connected to at least one power anode input wire and at least one power cathode input wire of the connection circuit; and wherein each of the plurality of LED bars further comprises:
- a substrate, wherein a plurality of die areas and a plurality of electrode areas are disposed on an upper surface of the substrate, and a plurality of electrode areas are disposed on a lower surface of the substrate;
- wherein the plurality of LED dies of the same type are arranged correspondingly in a tight linear arrangement in the plurality of die areas;
- wherein the wide-angle lens cover upon the plurality of LED dies and the substrate, the wide-angle lens is formed by using a molding process, wherein the molding process includes filling an epoxy or silicone in a mold cavity of a mold, wherein the mold cavity of the mold is processed based on the size of the wide-angle lens, the substrate having the plurality of LED dies of the same type is placed on an upper mold, the molding is completed by joining and baking the upper mold with the mold cavity, and the wide-angle lens that has a diffusing light-emitting angle is formed and completely covers upon the plurality of LED dies;
- wherein a connector is disposed on the circuit board, the connector is configured to be placed on the circuit board and respectively in electrical connection with the power anode input wire and the power cathode input wire of the connection circuit so as to be connected to an external power input.

11. The surface light source LED device according to claim 1, wherein the plurality of LED bars of the plurality of LED bar elements comprise two types of LED bars emitting different colors, the LED bars emitting light of a first color are arranged in a linear or arced manner on the circuit board, and the LED bars emitting light of a second color are arranged in another linear or arced manner on the circuit board, and the LED bars emitting lights of the first and second colors are arranged parallel or alternatingly symmetric to each other on the circuit board.

12. The surface light source LED device according to claim 1, further comprising at least one LED driving IC (integrated circuits) disposed on the circuit board, wherein each of the plurality of LED bars is electrically connected to the LED driving IC through the connection circuit of the circuit board, and wherein the LED driving IC is electrically connected to the power input through the connection circuit of the circuit board.

* * * * *